(12) United States Patent
Dwivedi et al.

(10) Patent No.: US 8,502,568 B2
(45) Date of Patent: Aug. 6, 2013

(54) RECEIVER CIRCUIT WITH HIGH INPUT VOLTAGE PROTECTION

(75) Inventors: Sandeep Dwivedi, Bangalore (IN); Nidhir Kumar, Bangalore (IN); Sridhar Cheruku, Bangalore (IN)

(73) Assignee: ARM Limited, Cambridge (GB)

( * ) Notice: Subject to any disclaimer, the term of this patent is extended or adjusted under 35 U.S.C. 154(b) by 515 days.

(21) Appl. No.: 12/805,734

(22) Filed: Aug. 17, 2010

(65) Prior Publication Data

US 2012/0044608 A1 Feb. 23, 2012

(51) Int. Cl.
*H03B 1/00* (2006.01)

(52) U.S. Cl.
USPC ......................................................... 327/108

(58) Field of Classification Search
USPC .................................. 327/108–112; 235/491
See application file for complete search history.

(56) References Cited

U.S. PATENT DOCUMENTS

| 5,777,318 A | * | 7/1998 | Krishnamoorthy et al. ....................... 250/214 LS |
| 6,724,226 B2 | | 4/2004 | Kim |

* cited by examiner

*Primary Examiner* — Daniel Rojas
(74) *Attorney, Agent, or Firm* — Nixon & Vanderhye P.C.

(57) ABSTRACT

An integrated circuit 2 includes a receiver circuit 4 for receiving an input signal PAD and converting this to an output signal OUT. Conduction path circuitry 14 couples an input 10 to a first node 16. Buffer circuitry 18 is coupled between the first node 16 and an output 12 carrying the output signal Out. The conduction path circuitry comprises a first PMOS transistor 24 and a second PMOS transistor 26 connected between the input 10 and the first node 16. A first NMOS transistor 28 is connected between the input 10 and the first node 16. The gate of the second PMOS transistor 26 is coupled to the output 12 to directly receive the output signal and thereby achieve rapid cut off of the charging of the node 16 when the input voltage rises beyond a certain level which switches the buffer circuitry 18.

17 Claims, 10 Drawing Sheets

RECEIVER CIRCUIT WITH HIGH INPUT VOLTAGE PROTECTION

BACKGROUND OF THE INVENTION

1. Field of the Invention

This invention relates to the field of integrated circuits. More particularly, this invention relates to receiver circuits for use within integrated circuits for receiving an input signal at an input and converting the input signal to an output signal for use within the integrated circuit.

2. Description of the Prior Art

As process geometries have scaled downward in size and operating voltages have reduced for integrated circuits, there is a growing difference between the interface voltages for integrated circuits and the internal operating voltages. As an example, an interface to the integrated circuit may be defined as operating at 2.7V, whereas the integrated circuit itself may operate at a much lower voltage (e.g. to save power) such as 1V. The input and output circuits are the interface between the external world and the core (interior of the integrated circuit). The core voltage is continuously changing as the technology scales down, but external voltage does not change as frequently, as it is dictated by the common standard and also needs to be backward compatible with earlier generations of circuits and hence the external voltage does not scale down as much with each generation. Such receiver circuits need to operate over a wide voltage range and should not themselves impose a significant signal throughput restriction.

A problem which arises within such receiver circuits when the process size decreases is that oxide layer overstress within NMOS and PMOS devices may occur. For example, this may arise when an NMOS device designed to function within an integrated circuit having a maximum operating voltage of 1.8V but that is subject to an input voltage at its gate having a much higher voltage level, such as 2.7V. This can cause the thin oxide layer to break down and the circuit to malfunction. Voltage tolerant circuits may be provided using zero voltage threshold devices, but such measures require the use of additional masks during manufacture which is a significant disadvantage.

FIG. 12 of the accompanying drawings illustrates one example of a known voltage tolerant receiver circuit. This circuit cannot tolerate voltages of more than 2.7V. Furthermore, in order to ensure correct operation, the delay of the transistor MP1 must be larger than the delay of transistor MP2 so that the pad voltage does not pass to the input node (node 1) of the receiver. As a consequence of this slow transistor within the signal path, the performance of the receiver circuit is degraded and this results in duty cycle distortion.

FIG. 13 of the accompanying drawings illustrates a second known voltage tolerant receiver circuit. This circuit has the disadvantage that for fast slew rates at the input PAD, the node RX_IN is charged to more than 2V and does not discharge to 2V. This creates a reliability problem for the NMOS transistors within the inverter following the RX_IN node. Another problem with this circuit is that when the input voltage PAD is at or above the receiver supply voltage DVDD plus the switching threshold of the transistors, the transmission gate still conducts and so the node RX_IN is charged to more than 2V and once it is charged to this level there is no discharge path.

SUMMARY OF THE INVENTION

Viewed from one aspect the present invention provides an integrated circuit having an input for receiving an input signal to said integrated circuit and a receiver circuit coupled to said input and configured to convert a voltage level of said input signal to an output signal for use within said integrated circuit, said receiver circuit comprising:

conduction path circuitry coupled between said input and a first node and configured to provide a conduction path between said input and said first node; and buffer circuitry coupled between said first node and an output for outputting said output signal; wherein said conduction path circuitry comprises a first PMOS transistor and a second transistor connected in series between said input and said first node and a first NMOS transistor connected in parallel with said first PMOS transistor and said second transistor between said input and said first node; and said second transistor has a gate input coupled to said output of said buffer circuitry to receive said output signal such that, as said input signal switches from a low potential to a high potential, said output signal driven by said buffer circuitry switches to a control potential that switches said second transistor to a low conductance state thereby blocking a conduction path from said input to said first node via said first PMOS transistor and said second transistor.

The use of the conduction path circuitry with a second transistor within one of the parallel paths between the input and the first node with that second transistor being switched by the output of the buffer circuitry assists in producing better performance within the receiver circuit by ensuring that the current path from the input to the node is blocked when the input voltage has reached a level sufficient to switch the output of the buffer circuitry. This improved mechanism for cutting off of the conduction path from the input to the first node has the advantage of permitting higher current strength devices to be used for the first PMOS transistor and the second transistor thereby safely improving performance and duty cycle.

The receiver circuitry may additionally be provided with an overvoltage-reduction NMOS transistor coupled between the first node and the receiver power supply rail with its gate coupled to the input signal. In this way, if the input signal voltage exceeds the receiver power supply voltage by an amount at least equal to the switching threshold of the overvoltage-reduction NMOS transistor, then this overvoltage-reduction NMOS transistor will be switched to a high conductance state draining charge from the first node and thus providing a way for an excessive build up of voltage at the first node to be dissipated. The overvoltage-reduction NMOS transistor will conduct initially when the first node is at zero voltage and the input voltage starts rising and will drain excessive charge build up at the first node when the first node voltage is above the receiver power rail voltage and the input voltage is above the receiver power rail voltage plus the switching threshold voltage.

The first PMOS transistor may have a gate coupled to a second node within the circuit. This second node can be coupled to the output of the buffer circuitry via a voltage-drop transistor which is switched to a conduction state such that when the output signal from the buffer circuitry switches from a low potential to a high potential, then the conductance through the first PMOS transistor is reduced.

It will be appreciated that in this type of embodiment, conduction through the first PMOS transistor may not be fully switched off when the output of the buffer circuitry switches and accordingly further embodiments may include a shut-down PMOS transistor coupled between the input and a second node with the shut-down PMOS transistor having a gate coupled to the receiver power supply rail such that if the input signal has a potential exceeding the receiver power supply voltage by an amount at least equal to the switching threshold of the shut-down PMOS transistor, then the shut-down PMOS transistor will be switched to a high conductance state thereby raising the potential at the second node and further reducing the conductance of the first PMOS transistor (e.g. fully switching off the first PMOS transistor should the input voltage rise to a high level).

Viewed from another aspect the present invention provides an integrated circuit having an input for receiving an input signal to said integrated circuit and receiver means coupled to said input for converting a voltage level of said input signal to an output signal for use within said integrated circuit, said receiver circuit comprising:

transmission means coupled between said input and a first node for providing a conduction path between said input and said first node; and buffer means coupled between said first node and an output for outputting said output signal; wherein said transmission means comprises first PMOS transistor means and second transistor means connected in series between said input and said first node for providing a first conduction path and first NMOS transistor means connected in parallel with said first PMOS transistor means and said second transistor means between said input and said first node for providing a second conduction path; and said second transistor means has gate input means coupled to said output of said buffer circuitry means for receiving said output signal such that, as said input signal switches from a low potential to a high potential, said output signal driven by said buffer means switches to a control potential that switches said second transistor means to a low conductance state thereby blocking said first conduction path from said input to said first node via said first PMOS transistor means and said second transistor means.

Viewed from a further aspect the present invention provides a method for receiving an input signal to an integrated circuit and converting a voltage level of said input signal to an output signal for use within said integrated circuit, said method comprising the steps of:

providing conduction path circuitry coupled between said input and a first node and configured to provide a conduction path between said input and said first node; and providing buffer circuitry coupled between said first node and an output for outputting said output signal; wherein said conduction path circuitry comprises a first PMOS transistor and a second transistor connected in series between said input and said first node and a first NMOS transistor connected in parallel with said first PMOS transistor and said second transistor between said input and said first node; and said second transistor has a gate input coupled to said output of said buffer circuitry to receive said output signal; further comprising the step of as said input signal switches from a low potential to a high potential, switching said output signal driven by said buffer circuitry to a control potential that switches said second transistor to a low conductance state thereby blocking a conduction path from said input to said first node via said first PMOS transistor and said second transistor.

The above, and other objects, features and advantages of this invention will be apparent from the following detailed description of illustrative embodiments which is to be read in connection with the accompanying drawings.

DESCRIPTION OF THE EMBODIMENTS

Figure 1:
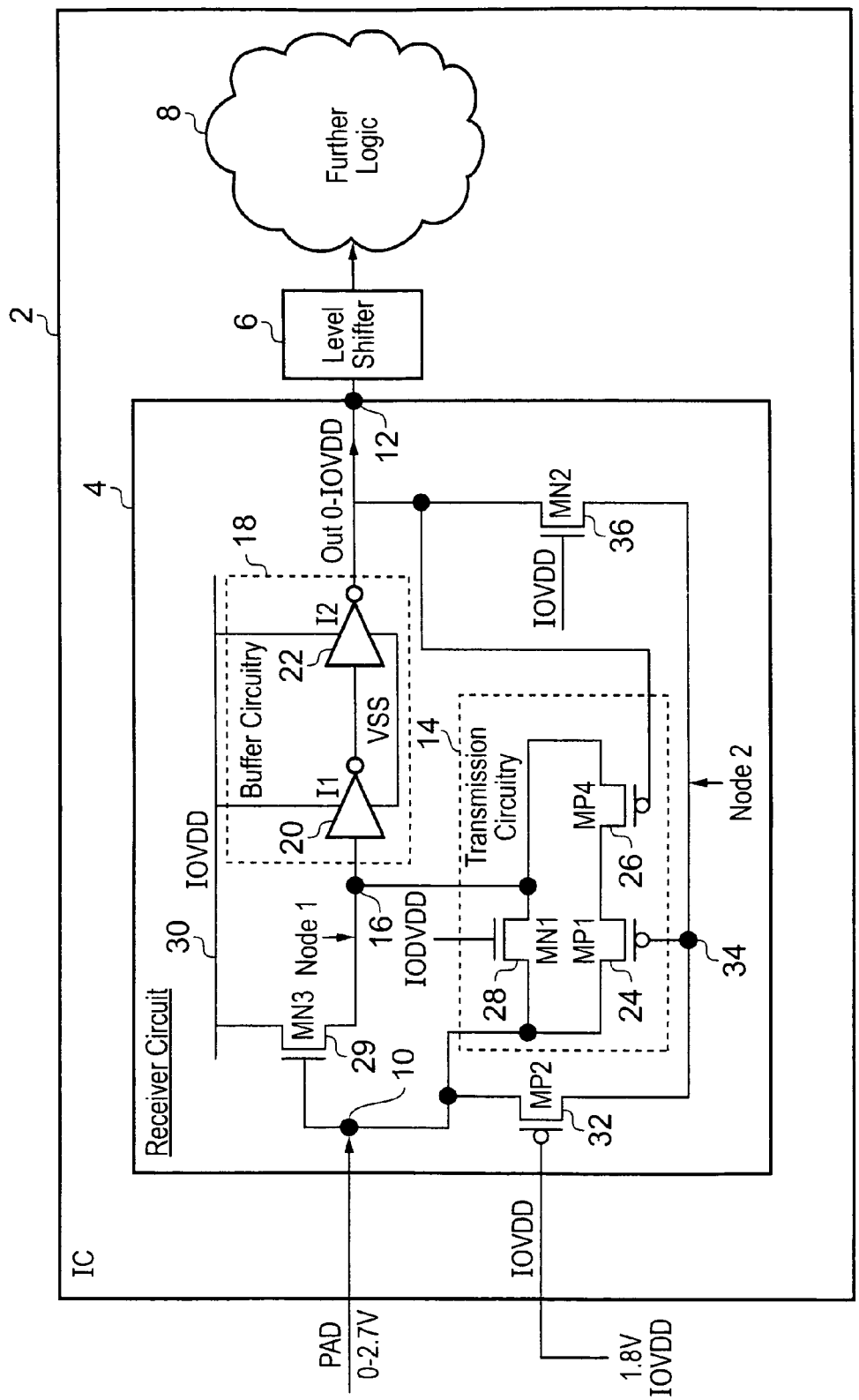
FIG. 1 schematically illustrates an integrated circuit including a receiver circuit.

FIG. 1 schematically illustrates an integrated circuit 2 including a receiver circuit 4, level shifter circuitry 6 and further processing logic 8. The receiver circuit 4 receives an input signal PAD at an input 10 and converts this input signal PAD to an output signal Out at an output 12 where it is received by the level shifter circuitry 6. The level shifter circuitry 6 performs any necessary voltage level shifting required in dependence upon the current operating parameters of the further processing logic 8 in order to match the voltage of the output signal Out to the requirements of the further processing logic 8.

The receiver circuit 4 includes conduction path circuitry 14 coupled between the input 10 and a first node 16. Buffer circuitry 18 is coupled between the first node 16 and the output 12. The buffer circuitry 18 is formed of two inverters 20, 22. These inverters may be formed in the conventional manner as a stack of a PMOS transistor and an NMOS transistor connected between a receiver power supply rail 30 and ground VSS with the gates of both of these transistors being coupled to the input to the inverter and the node between the two transistors being used to drive the output from the inverter. In this arrangement, the NMOS transistor of the first inverter 20 may be vulnerable to oxide layer overstress as previously discussed and accordingly it is important that the voltage at the first node 16 does not rise too high irrespective of the voltage which is received at the input 10. Alternatively, the standard inverter 20 may be replaced by the inverter structure shown in FIG. 6 composed of transistors MP5, MP6 and MN5 as this is less prone to permitting undesirable leakage currents.

The conduction path circuitry comprises a first PMOS transistor 24 and a second PMOS transistor 26 connected in series between the input 10 and the first node 16. In parallel with the first PMOS transistor 24 and the second PMOS transistor 26 there is provided a first NMOS transistor 28 which is also connected between the input 10 and the first node 16.

An overvoltage-reduction NMOS transistor 29 is coupled between the receiver circuit power supply rail 30 and the first node 16. The gate of the overvoltage-reduction NMOS transistor 29 is coupled to the input 10. A shut-down PMOS transistor 32 is coupled between the input 10 and a second node 34. The gate of this shut-down PMOS transistor is held at the receiver circuit supply voltage IOVDD. A voltage-drop transistor 36 is provided between the output 12 and the second node 34 with the gate of this voltage-drop transistor being held at a voltage which renders the voltage-drop transistor conductive when the voltage at the output 12 is low.

The gate of the first PMOS transistor 24 is coupled to the second node 34. The gate of the second PMOS transistor 26 is coupled to the output 12 and receives the output signal therefrom.

Figure 2:
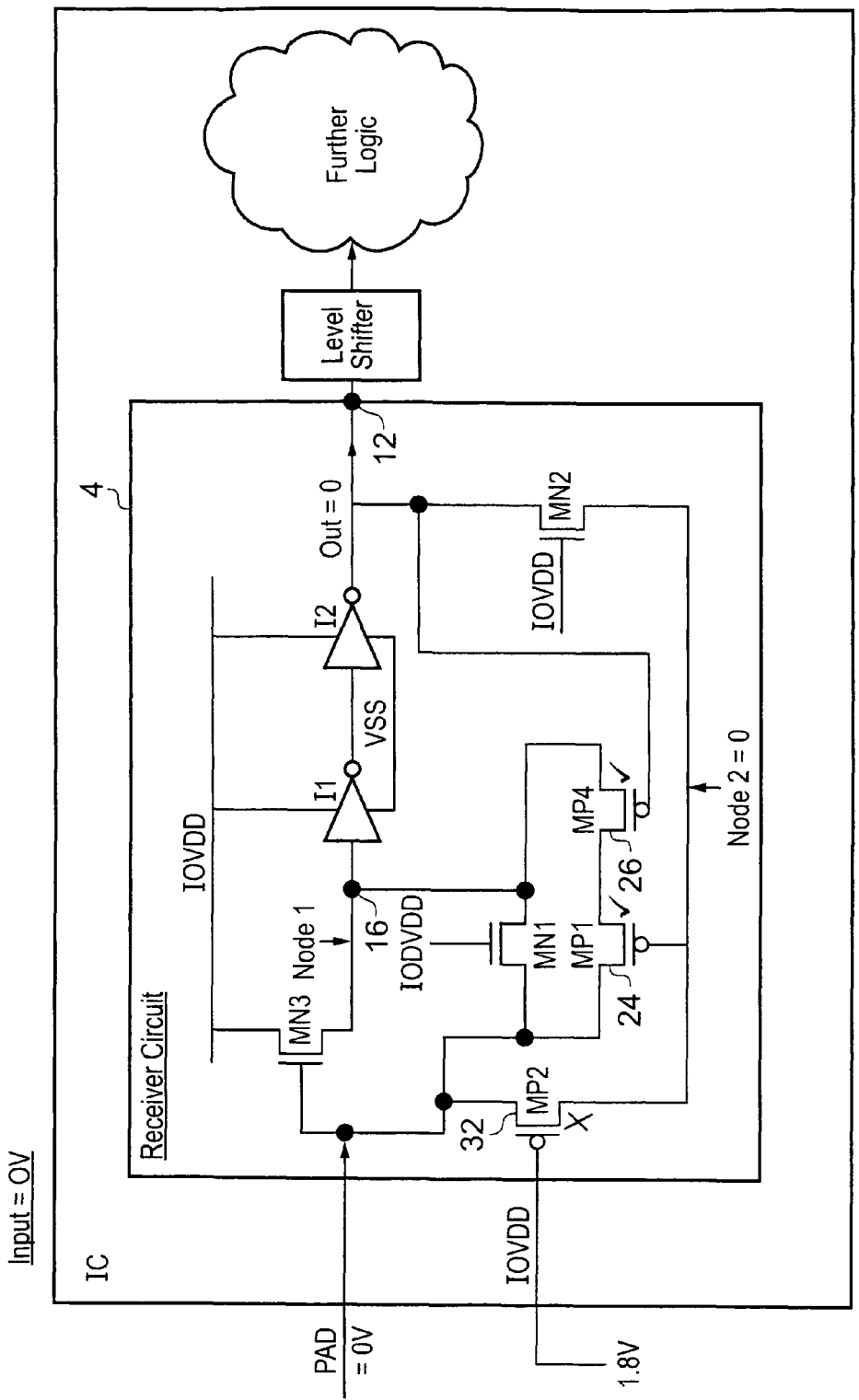
FIGS. 2, 3, 4 and 5 schematically illustrate the operation of the receiver circuit of FIG. 1.

FIG. 2 illustrates a starting state of the receiver circuit 4 when transitioning from a low input signal voltage of 0V toward a high input signal voltage of 2.7V. In this starting condition, the input signal voltage level is 0V, the voltage at the first node 16 is also 0V as is the voltage at the output 12. The first PMOS transistor 24 and the second PMOS transistor 26 are both switched on. The shut-down PMOS transistor 32 is switched off.

Figure 3:
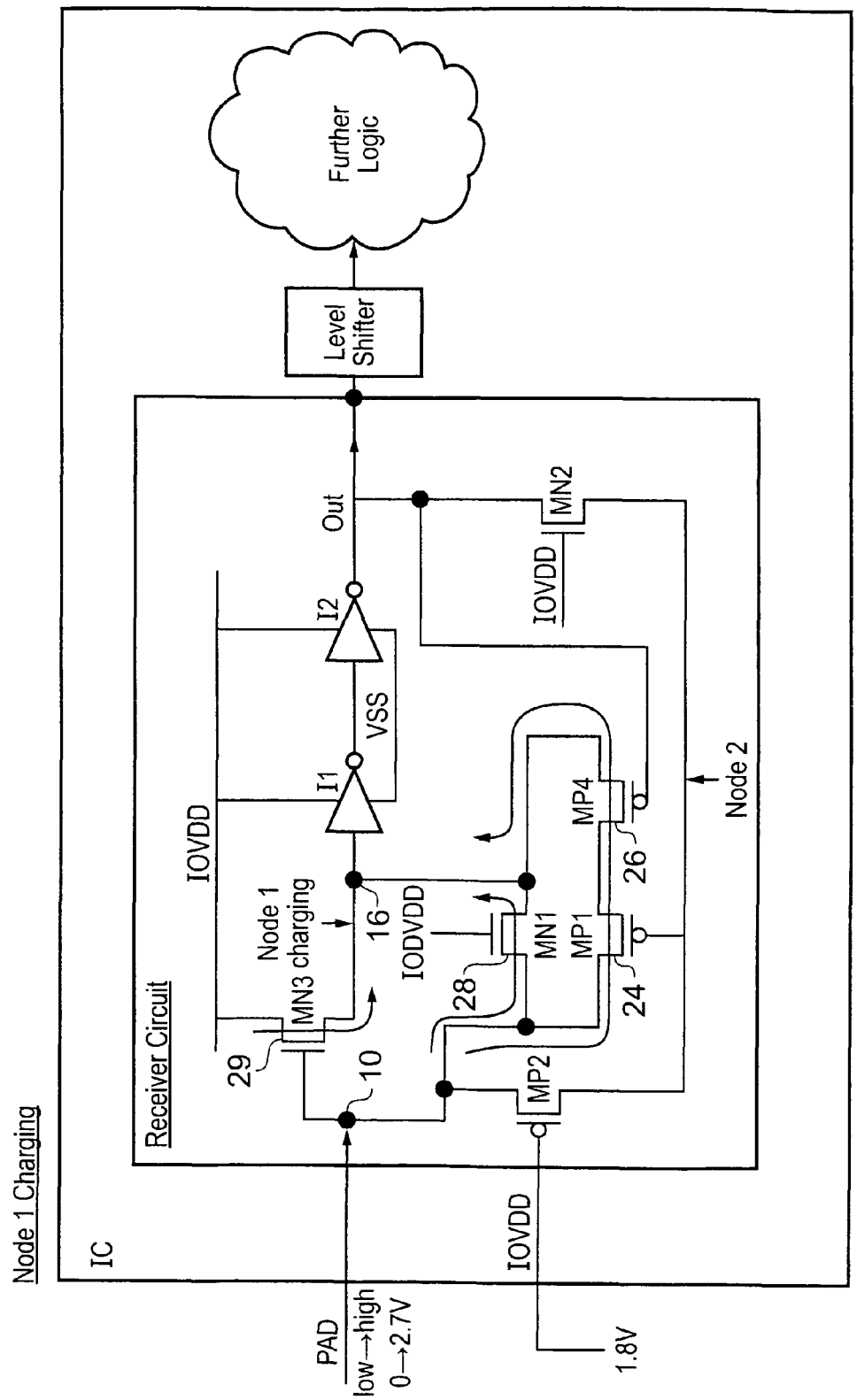
Figure 4:
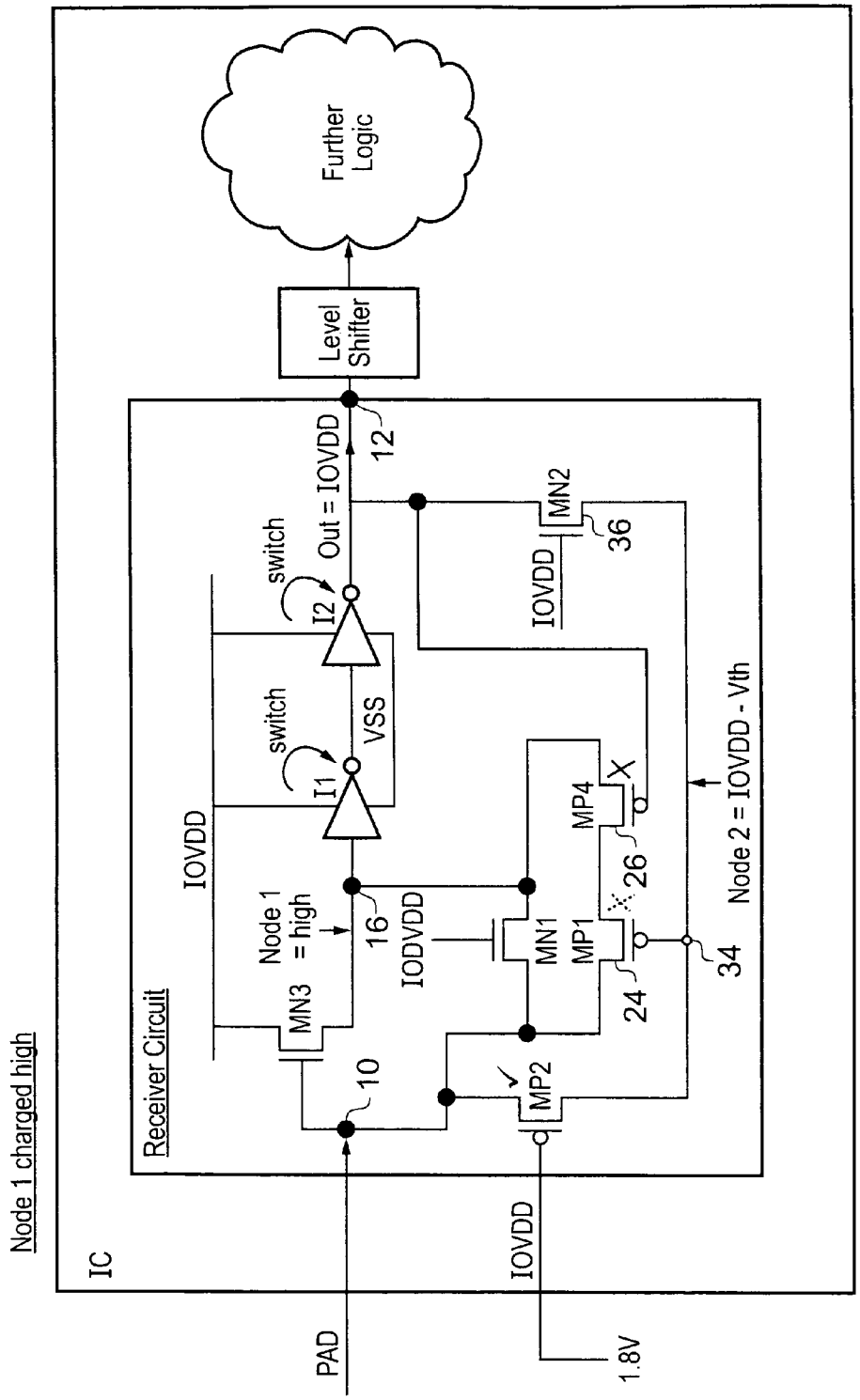

FIG. 3 illustrates the situation a small time later than shown in FIG. 2 as the input voltage at input 10 has started to rise. The first node 16 will begin to charge towards the receiver circuit power supply voltage IOVDD with conduction taking place through the first NMOS transistor 28, the first PMOS transistor 24, the second PMOS transistor 26 and the overvoltage-reduction NMOS transistor 29. As soon as the first node 16 is charged to a sufficient level, the inverters 20 and 22 will switch state. This is illustrated in FIG. 4.

When the output signal at the output 12 switches to the high level (IOVDD) this output signal is passed directly to the gate of the second PMOS transistor 26 and thereby switches this off (i.e. to a low conductance state). At the same time, the output signal is passed via the voltage-drop transistor 36 to the gate of the first PMOS transistor 24 and accordingly the first PMOS transistor 24 is at least partially switched off. The second node 34 is charged to a voltage of IOVDD−Vth (i.e. the receiver circuit power supply voltage minus the switching threshold voltage of the voltage-drop transistor 36).

It will be appreciated that as the second node 34 approaches, the voltage of IOVDD−Vth, the drive strength to the first node 16 will be reduced. This reduction is enhanced by the action of the second PMOS transistor 26 which has its gate directly connected to the output 12 and so helps to achieve an early cut-off of the charging path from the input 10 to the first node 16.

Figure 5:
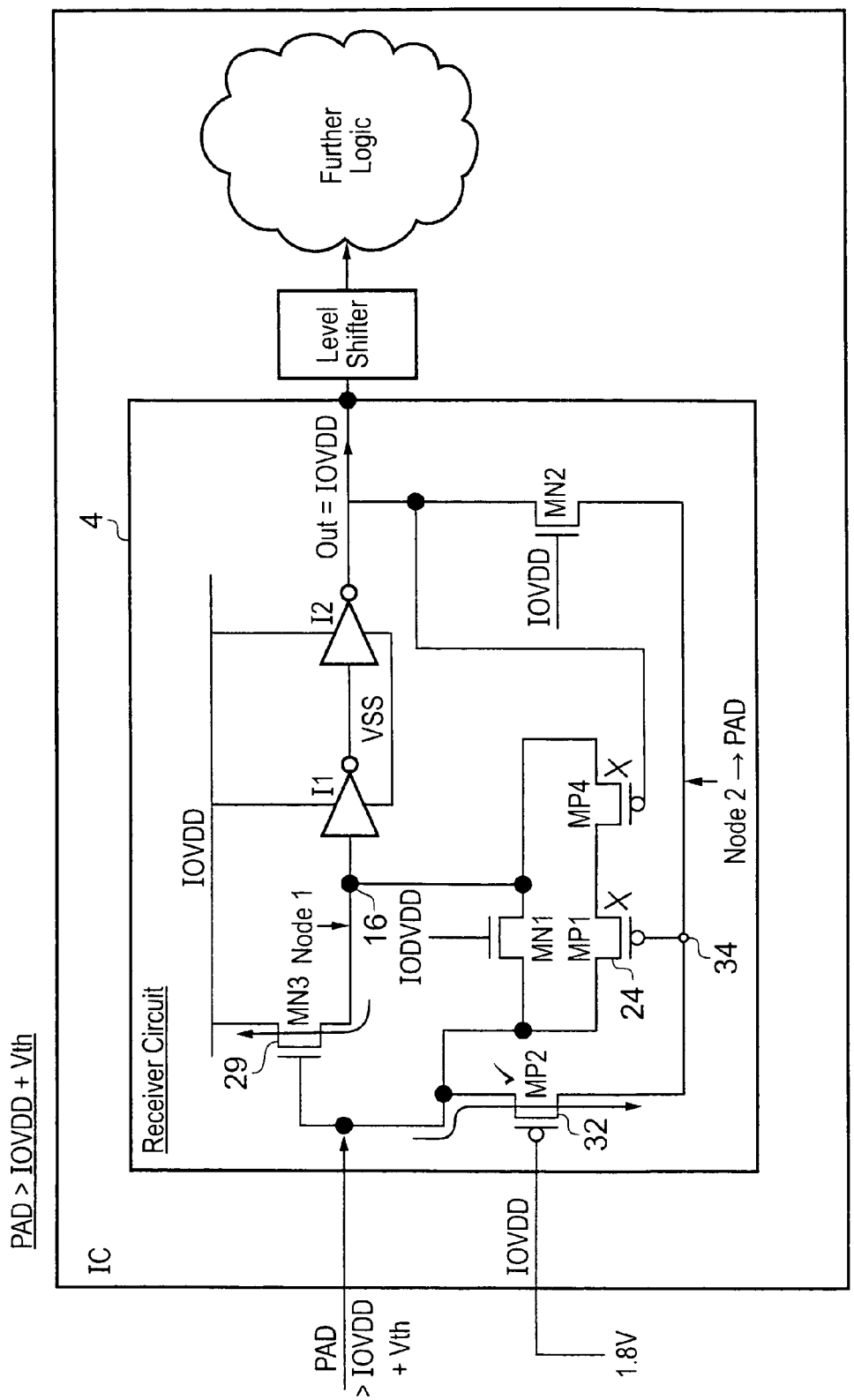

FIG. 5 illustrates the situation when the input voltage PAD starts to exceed the receiver circuit supply voltage IOVDD plus the switching threshold voltage of the shut-down PMOS transistor 32. In this case, the shut-down PMOS transistor 32 is switched on and this charges the second node 34 to a higher voltage hence assisting in the switching off of the first PMOS transistor 24.

The action of the overvoltage-reduction NMOS transistor 29 is to discharge the first node 16 when the input voltage PAD is greater than the receiver circuit supply voltage IVODD plus the threshold switching voltage of the overvoltage-reduction NMOS transistor 29. The overvoltage-reduction NMOS transistor 29 and the shut-down PMOS transistor 32 become active when the input voltage is high and exceeds the receiver circuit power supply voltage IOVDD by a margin sufficient to active these transistors.

During transient periods when the input voltage PAD is going from 0 to 2.7V, the gate-to-source voltage of the first PMOS transistor 24 can exceed 2.3V for short durations (i.e. the voltage between the input 10 and the second node 34). However, this short impulse of high voltage does not cause a significant lifetime degradation or otherwise impact the performance to the receiver circuit 4.

The receiver circuit 4 illustrated in FIGS. 1 to 5 can operate successfully with an input voltage in the range 0V to 2.7V, and a receiver power supply voltage of any of 1V/1.5V/1.8V. The input signal voltage corresponding to a high potential output signal may be as low as 0.7V and the circuit will still operate successfully to convert such a low input voltage to an output voltage for use by the remainder of the integrated circuit.

Figure 6:
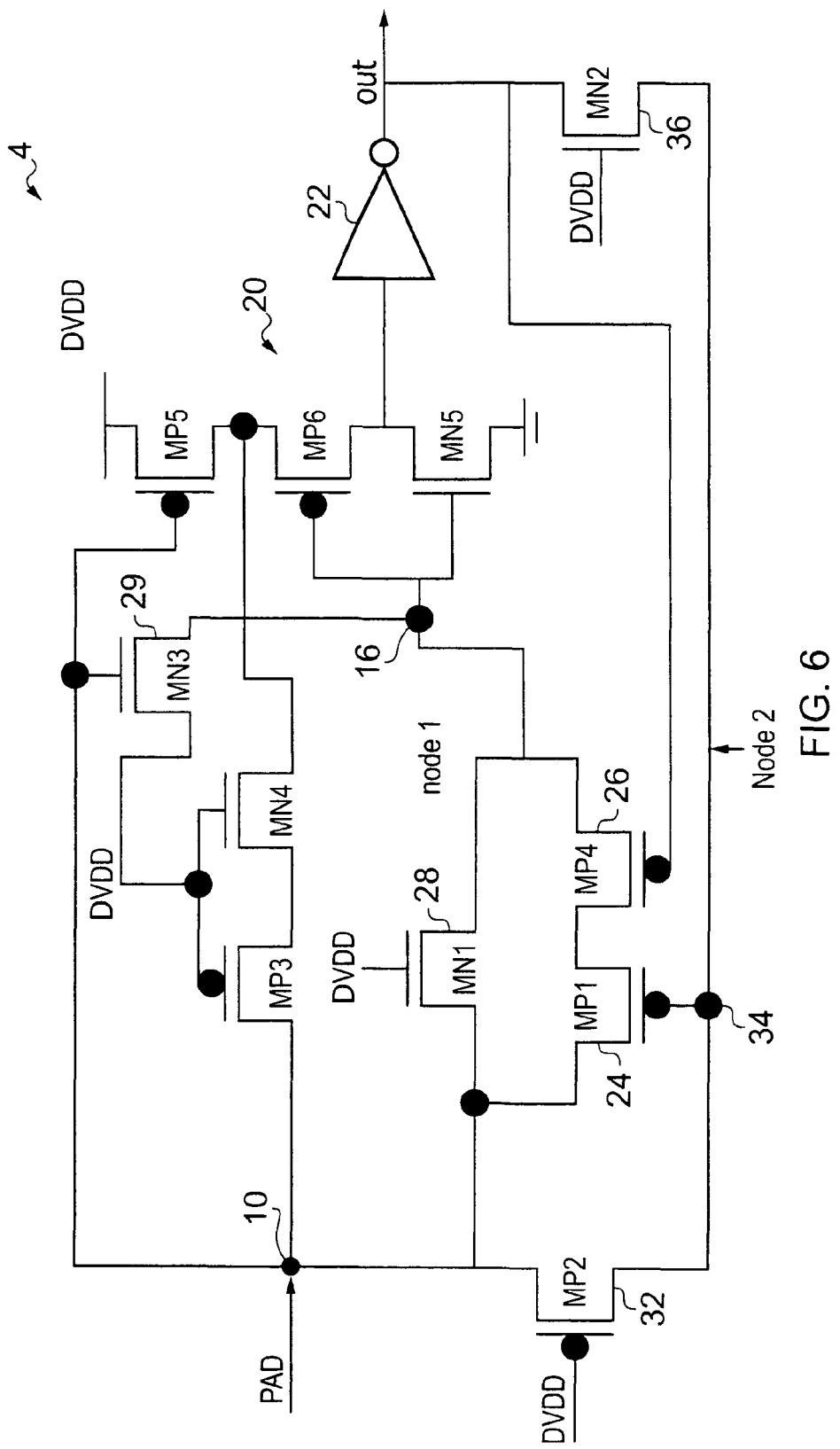
FIG. 6 schematically illustrates in more detail the receiver circuit of FIG. 1

FIG. 6 illustrates an example of the receiver circuit 4 of FIG. 1 in more detail with the like elements having the same references. Transistor MP5 is provided to help cut the leakage path when the signal PAD is high, transistors MP1 and MP4 are turned off and Node 1 is charged to DVDD−Vth (threshold voltage). The transistors MP3 and MN4 are used so that neither of the terminals of transistor MP5 are exposed to more than a rated voltage. The input 10 is directly connected to transistor MP5 which forms part of the first inverter structure 20 so as to reduce DC leakage current when the input 10 is high and the first node 16 is not fully charged to IOVDD with the transistors 24 and 26 turned off after detecting a high voltage at the output 12. Transistor MN4 serves to ensure that transistor MP5 (vgd) does not exceed the rated voltage. Transistor MP3 serves to ensure that when the voltage at input 10 is zero, that zero voltage does not propagate to the drain of transistor MP5 and also in this condition that there is reduced DC leakage current.

Figure 7:
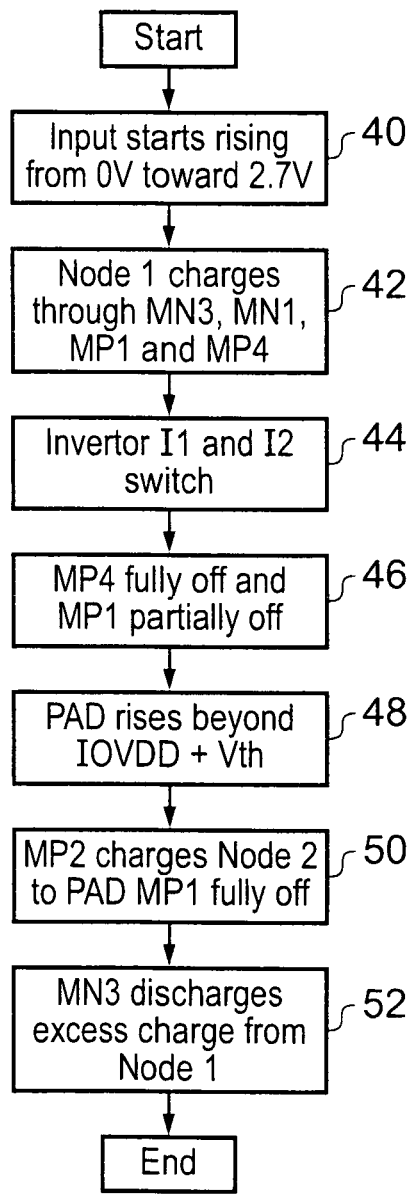
FIG. 7 is a flow diagram schematically illustrating the operation of the receiver circuit of FIG. 1.

FIG. 7 is a flow diagram schematically illustrating operation of the receiver circuit 4 as illustrated in FIGS. 2 to 5 above. At step 40 the input signal starts to rise towards 2.7V. At step 42 the first node charges through the overvoltage-reduction transistor 29, the first NMOS transistor 28, the first PMOS transistor 24 and the second PMOS transistor 26. At step 44 the inverters 20, 22 switch state and the output signal is driven high to the voltage level of the receiver circuit power supply voltage IOVDD. Step 46 corresponds to the output signal fully switching off the second PMOS transistor 26 and partially switching off the first PMOS transistor 24 by charging the second node 34 to a high potential level via the voltage-drop transistor 36.

At step 48 the input voltage PAD starts to rise beyond the receiver circuit power supply voltage IOVDD plus the switching threshold voltage of the transistors. At step 50 the shut-down PMOS transistor 32 is switched on and charges the second mode 34 higher toward the input voltage PAD which fully switches off the first PMOS transistor 24. At step 52, the overvoltage-reduction NMOS transistor 29 serves to discharge excess charge from the first nodes 16 through to the receiver circuit power supply rail 30.

Figure 8:
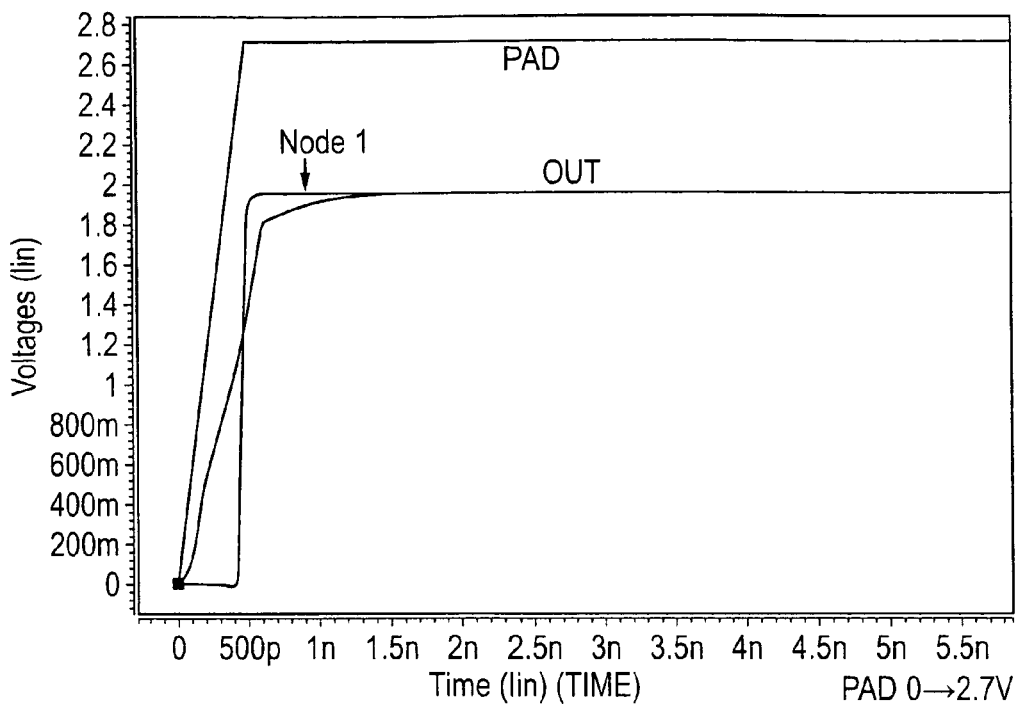
FIG. 8 is a signal diagram illustrating the behaviour of the receiver circuit of FIG. 1 when the input voltage transitions from 0 to 2.7V.

FIG. 8 shows the simulated behaviour of the receiver circuit 4 when the input voltage ramps from 0V to 2.7V with the result that first node voltage stays below 2V which is the safe limit for oxide layer breakdown. The output signal is seen switching from 0V to IOVDD.

Figure 9:
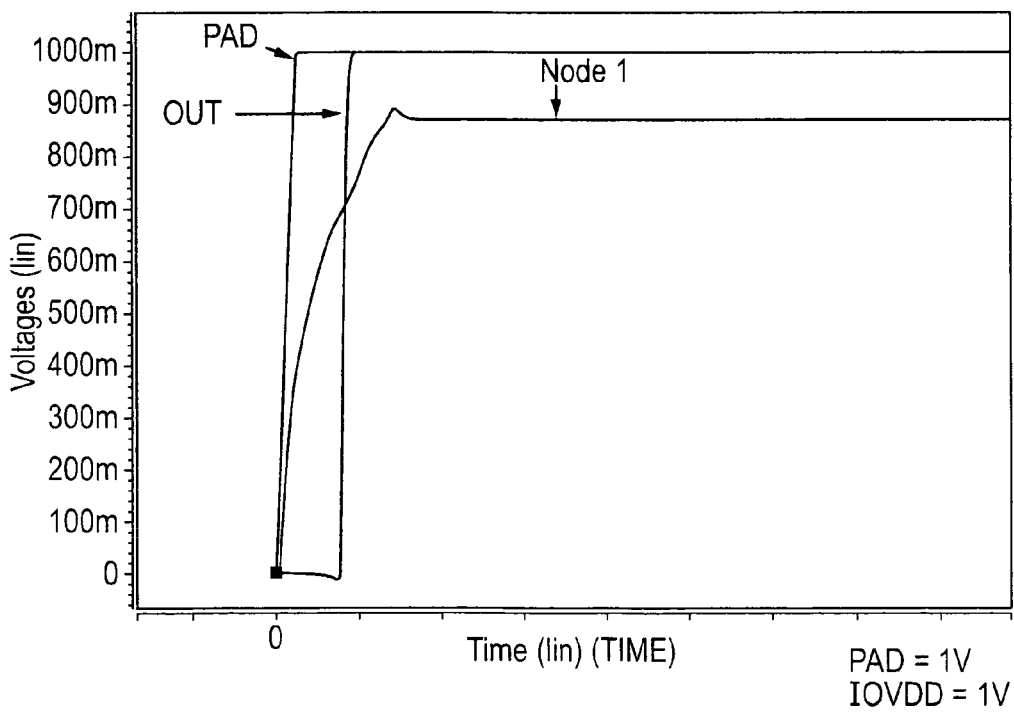
FIG. 9 is a signal diagram illustrating the behaviour of the receiver circuit of FIG. 1 when the input voltage transitions from 0 to 1V.

FIG. 9 illustrates the simulated behaviour of the receiver circuit 4 when the input voltage is switched between 0 and 1V and the receiver circuit power supply voltage is 1V. In this arrangement the output signal is still able to switch properly to the receiver circuit power supply voltage IOVDD even though the first node does not reach this voltage.

Figure 10:
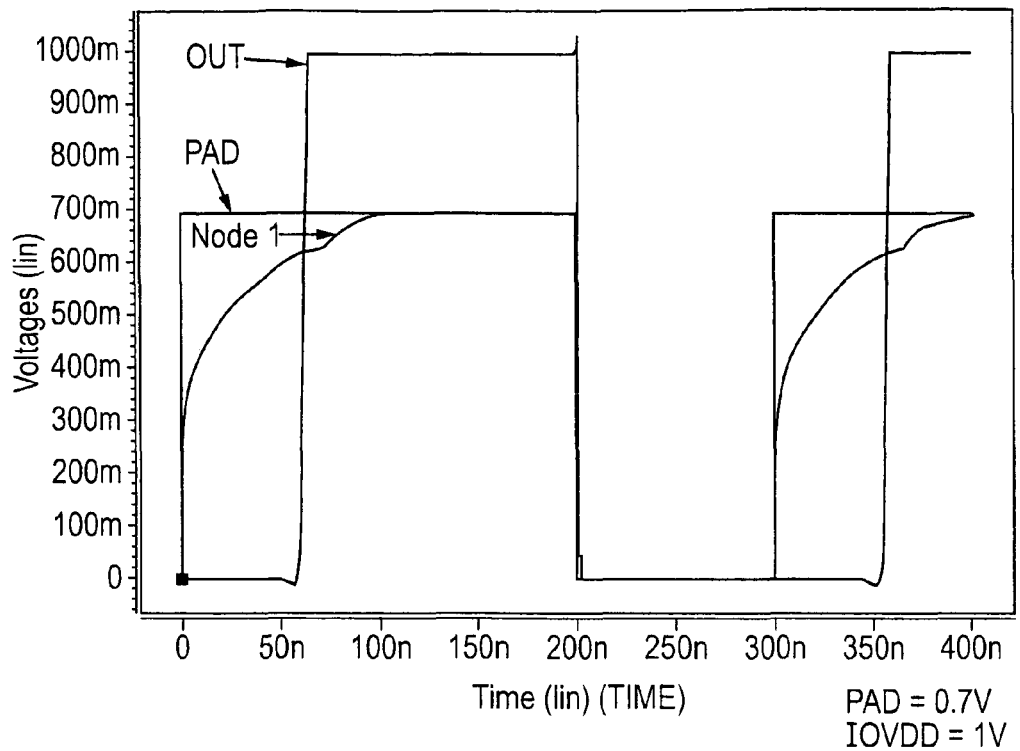
FIG. 10 is a signal diagram illustrating the behaviour of the receiver circuit of FIG. 1 when the input voltage varies from 0 to 0.7V.

FIG. 10 illustrates the simulated behaviour of the receiver circuit 4 when the input voltage rises from 0V to 0.7V and the receiver circuit power supply voltage is 1V. In this circumstance, it will be seen that the output signal still properly switches to the receiver circuit power supply voltage and the first node voltage eventually rises to the input voltage.

Figure 11:
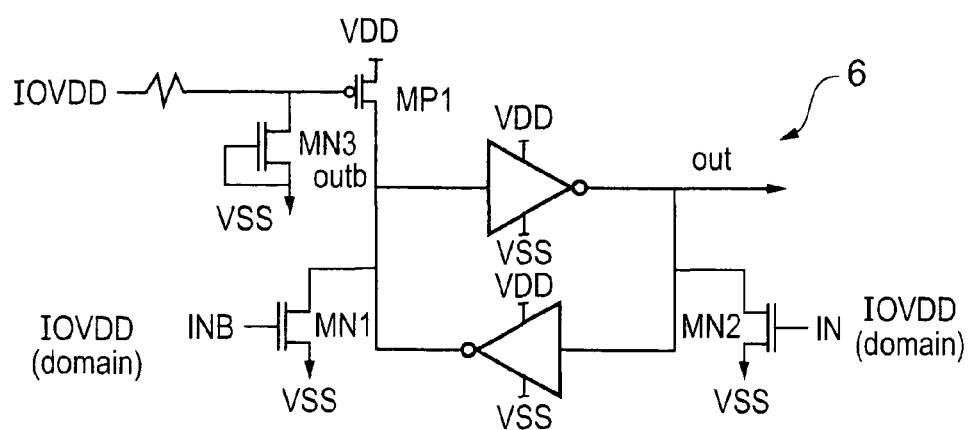
FIG. 11 schematically illustrates level shifting circuitry for use after the receiver circuit for shifting the output signals to a voltage level suitable for use in the remainder of the integrated circuit.
Figure 12:
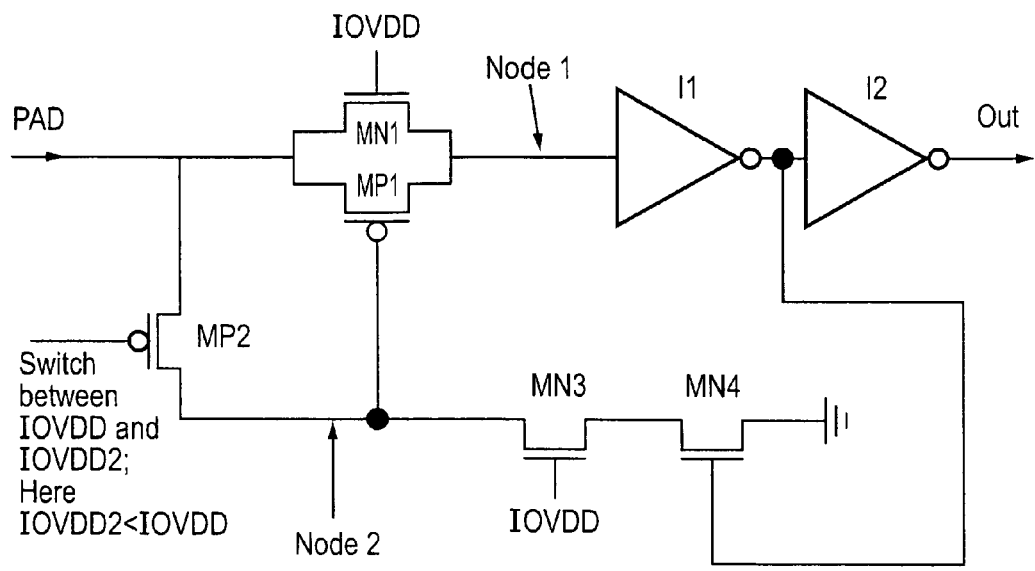
FIG. 12 illustrates a first example of a known voltage tolerant receiver circuit.
Figure 13:
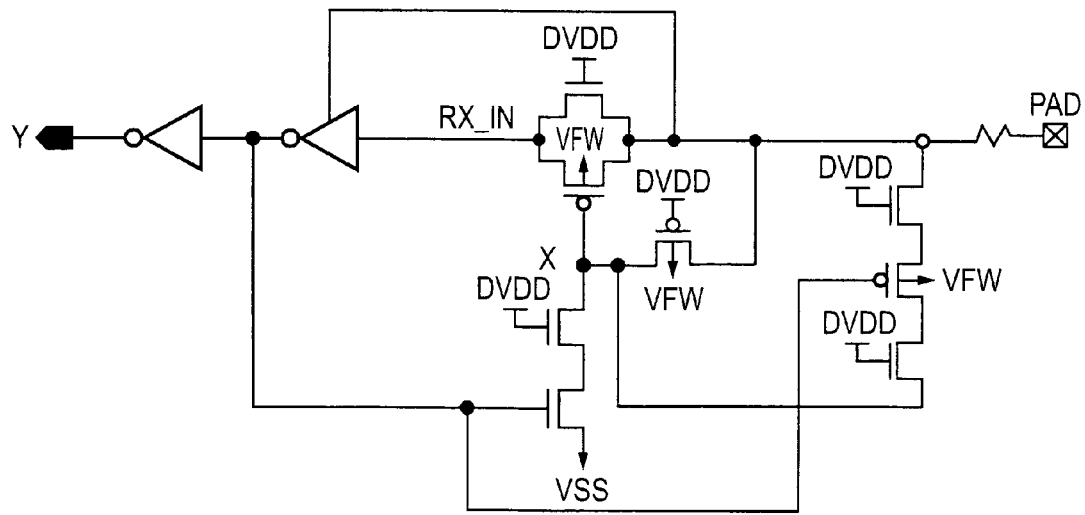
FIG. 13 illustrates a second example of a known voltage tolerant receiver circuit.

FIG. 11 illustrates an example level shifter circuit 6. This level shifter circuit 6 is able to supply multiple domains with different voltage requirements.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit having an input for receiving an input signal to said integrated circuit and a receiver circuit coupled to said input and configured to convert a voltage level of said input signal to an output signal for use within said integrated circuit, said receiver circuit comprising:

conduction path circuitry coupled between said input and a first node and configured to provide a conduction path between said input and said first node; and buffer circuitry coupled between said first node and an output for outputting said output signal; wherein said conduction path circuitry comprises a first PMOS transistor and a second transistor connected in series between said input and said first node and a first NMOS transistor connected in parallel with said first PMOS transistor and said second transistor between said input and said first node; and said second transistor has a gate input coupled to said output of said buffer circuitry to receive said output signal such that, as said input signal switches from a low potential to a high potential, said output signal driven by said buffer circuitry switches to a control potential that switches said second transistor to a low conductance state thereby blocking a conduction path from said input to said first node via said first PMOS transistor and said second transistor.

2. An integrated circuit as claimed in claim 1, wherein said second transistor is a second PMOS transistor and said control potential corresponds to said output signal switching from a low potential to a high potential.

3. An integrated circuit as claimed in claim 1, wherein said buffer circuitry comprises an even number of invertors such that said output signal is driven to follow said input signal.

4. An integrated circuit as claimed in claim 1, wherein said receiver circuit is supplied with a receiver power supply voltage via a receiver power supply rail.

5. An integrated circuit as claimed in claim 4, comprising an overvoltage-reduction NMOS transistor coupled between said first node and said receiver power supply rail, said overvoltage-reduction NMOS transistor having a gate input coupled to said input to receive said input signal such that if said input signal has a potential exceeding said receiver power supply voltage by an amount at least equal to a switching threshold voltage of said overvoltage-reduction NMOS transistor, then said overvoltage-reduction NMOS transistor is switched to a high conductance state draining charge from said first node.

6. An integrated circuit as claimed in claim 1, wherein said first PMOS transistor has a gate coupled to a second node, said second node being coupled to said output via a voltage-drop transistor switched to a high conductance state such that as said output signal switches from a low potential to a high potential conductance through said first PMOS transistor is reduced.

7. An integrated circuit as claimed in claim 6, wherein said receiver circuit is supplied with a receiver power supply voltage via a receiver power supply rail and comprising a shut-down PMOS transistor coupled between said input and said second node, said shut-down PMOS transistor having a gate coupled to said receiver power supply rail such that if said input signal has a potential exceeding said receiver power supply voltage by an amount at least equal to a switching threshold voltage of said shut-down PMOS transistor, then said shut-down PMOS transistor is switched to a high conductance state thereby raising potential at said second node and reducing conductance of said first PMOS transistor.

8. An integrated circuit as claimed in claim 1, wherein said first NMOS transistor has a gate coupled to a positive power rail to receive a positive power supply voltage.

9. An integrated circuit having an input for receiving an input signal to said integrated circuit and receiver means coupled to said input for converting a voltage level of said input signal to an output signal for use within said integrated circuit, said receiver circuit comprising:

transmission means coupled between said input and a first node for providing a conduction path between said input and said first node; and buffer means coupled between said first node and an output for outputting said output signal; wherein said transmission means comprises first PMOS transistor means and second to transistor means connected in series between said input and said first node for providing a first conduction path and first NMOS transistor means connected in parallel with said first PMOS transistor means and said second transistor means between said input and said first node for providing a second conduction path; and said second transistor means has gate input means coupled to said output of said buffer circuitry means for receiving said output signal such that, as said input signal switches from a low potential to high potential, said output signal driven by said buffer means switches to a control potential that switches said second transistor means to a low conductance state thereby blocking said first conduction path from said input to said first node via said first PMOS transistor means and said second transistor means.

10. A method for receiving an input signal to an integrated circuit and converting a voltage level of said input signal to an output signal for use within said integrated circuit, said method comprising the steps of:

providing conduction path circuitry coupled between said input and a first node and configured to provide a conduction path between said input and said first node; and providing buffer circuitry coupled between said first node and an output for outputting said output signal; wherein said conduction path circuitry comprises a first PMOS transistor and a second transistor connected in series between said input and said first node and a first NMOS transistor connected in parallel with said first PMOS transistor and said second transistor between said input and said first node; and said second transistor has a gate input coupled to said output of said buffer circuitry to receive said output signal; further comprising the step of as said input signal switches from a low potential to a high potential, switching said output signal driven by said buffer circuitry to a control potential that switches said second transistor to a low conductance state thereby blocking a conduction path from said input to said first node via said first PMOS transistor and said second transistor.

11. A method as claimed in claim 10, wherein said second transistor is a second PMOS transistor and said control potential corresponds to said output signal switching from a low potential to a high potential.

12. A method as claimed in claim 10, wherein said buffer circuitry comprises an even number of invertors such that said output signal is driven to follow said input signal.

13. A method as claimed in claim 10, wherein said receiver circuit is supplied with a receiver power supply voltage via a receiver power supply rail.

14. A method as claimed in claim 13, comprising providing an overvoltage-reduction NMOS transistor coupled between said first node and said receiver power supply rail, said overvoltage-reduction NMOS transistor having a gate input coupled to said input to receive said input signal such that if said input signal has a potential exceeding said receiver power supply voltage by an amount at least equal to a switching threshold voltage of said overvoltage-reduction NMOS transistor, then said overvoltage-reduction NMOS transistor is switched to a high conductance state draining charge from said first node.

15. A method as claimed in claim 10, wherein said first PMOS transistor has a gate coupled to a second node, said second node being coupled to said output via a voltage-drop transistor switched to a high conductance state such that as said output signal switches from a low potential to a high potential conductance through said first PMOS transistor is reduced.

16. A method as claimed in claim 15, wherein said receiver circuit is supplied with a receiver power supply voltage via a receiver power supply rail and comprising providing a shut-down PMOS transistor coupled between said input and said second node, said shut-down PMOS transistor having a gate coupled to said receiver power supply rail such that if said input signal has a potential exceeding said receiver power supply voltage by an amount at least equal to a switching threshold voltage of said shut-down PMOS transistor, then said shut-down PMOS transistor is switched to a high conductance state thereby raising potential at said second node and reducing conductance of said first PMOS transistor.

17. A method as claimed in claim 13, wherein said first NMOS transistor has a gate coupled to a positive power rail to receive a positive power supply voltage.

* * * * *